United States Patent [19]

Takafuji et al.

[11] Patent Number: 4,654,959
[45] Date of Patent: Apr. 7, 1987

[54] METHOD FOR THE MANUFACTURE OF THIN FILM TRANSISTORS

[75] Inventors: Yutaka Takafuji, Nara; Hiroaki Kato, Tenri; Fumiaki Funada, Yamatokoriyama, all, Japan

[73] Assignees: Sharp Kabushiki Kaisha; Japan Electronic Industry Development Association, both of Osaka, Japan

[21] Appl. No.: 853,034

[22] Filed: Apr. 17, 1986

Related U.S. Application Data

[60] Division of Ser. No. 786,190, Oct. 11, 1985, which is a continuation of Ser. No. 396,266, Jul. 8, 1982, abandoned.

[30] Foreign Application Priority Data

Jul. 15, 1981 [JP] Japan .................................. 56-111027

[51] Int. Cl.[4] .................. H01L 21/203; H01L 21/06; H01L 21/363
[52] U.S. Cl. ......................................... 29/571; 29/578; 29/584; 148/175; 357/4
[58] Field of Search ....................... 29/571, 578, 584; 148/175; 357/4

[56] References Cited

U.S. PATENT DOCUMENTS

| | | | |
|---|---|---|---|
| 3,481,031 | 12/1969 | Klasens | 29/571 |
| 3,513,042 | 5/1970 | Hagon | 148/187 |
| 3,658,586 | 4/1972 | Wang | 148/175 X |
| 4,208,686 | 8/1978 | Jacobus | 357/23.9 |
| 4,242,156 | 12/1980 | Peel | 148/175 |
| 4,318,216 | 3/1982 | Hsu | 29/571 |
| 4,404,578 | 9/1983 | Takafuji et al. | 357/23 TF |
| 4,447,823 | 5/1984 | Maeguchi et al. | 357/23 TF |

FOREIGN PATENT DOCUMENTS

98868 7/1980 Japan .................................. 357/23.7

Primary Examiner—George T. Ozaki
Attorney, Agent, or Firm—Birch, Stewart, Kolasch and Birch

[57] ABSTRACT

A thin film transistor comprises an insulating substrate, a semiconductor layer on the substrate, an electrically insulating oxide layer overlaying the semiconductor layer, and an electroconductive layer overlaying the oxide layer. The oxide layer is formed by oxidizing a portion of the semiconductor through a patterned opening in a photo resist. A method for the manufacture of the same is also disclosed.

4 Claims, 28 Drawing Figures

METHOD FOR THE MANUFACTURE OF THIN FILM TRANSISTORS

This application is a divisional of copending application Ser. No. 786,190, filed on Oct. 11, 1985, which is a continuation of application Ser. No. 396,266 filed on July 8, 1982 and now abandoned.

BACKGROUND OF THE INVENTION

This invention relates to a thin film transistor and a method for the manufacture thereof and, more particularly, to a method which can be easily performed with a reduced number of process steps, which can give a high yield and wherein a thin film transistor array manufactured by a self alignment process is highly reliable and capable of exhibiting good characteristics.

An example of a prior art method for making a thin film transistor is shown in FIG. 1 of the accompanying drawings which illustrates the prior art thin film transistor in cross-sectional view. As shown in FIG. 1, the prior art thin film transistor is of a construction comprising an insulating substrate 1, made of glass or the like and having one surface formed with a control gate electrode 2 thereon, an insulating film 3 covering the control gate electrode 2, a semiconductor layer 4 overlaying the insulating film 3, and source electrode 5 and the drain electrode 6 successively formed thereon. The gate electrode 2 is formed by the use of a masked vapor deposition of a metal such as Al, Au, Ta, Ni or the like whereas the insulating film 3 is made of $Al_2O_3$, SiO, $SiO_2$, $CaF_2$, $Si_3N_4$ or the like and formed by the use of a vacuum deposition technique, a sputtering technique, a chemical vapor deposition technique or the like. Where the gate electrode 2 is made of Al, Ta or the like, it is possible to form the insulating film 3 by the use of an anodization technique. On the other hand, the semiconductor layer 4 is generally made of CdSe, CdS, Te or the like and is formed by the use of a vacuum deposition technique, a sputtering technique or the like. Each of the source and drain electrodes 5 and 6 is made of a material, for example, Au, Ni, In or the like, which is capable of exhibiting an ohmic contact with the semiconductor layer 4.

Other than the thin film transistor of the construction shown in FIG. 1, conventionally available are a thin film transistor wherein, as shown in FIG. 2, the semiconductor layer 4 and a combination of the source and drain electrodes 5 and 6 are substantially reversed in position with respect to that shown in FIG. 1, a thin film transistor wherein, as shown in FIG. 3, the semiconductor layer 4 is formed on the substrate 1 together with and between the source and drain electrodes 5 and 6 on the substrate 1 and the gate electrode 2 is deposited on the layer 4 with the insulating layer 3 formed between the electrode 2 and the layer 4, and a thin film transistor wherein, as shown in FIG. 4, respective portions of the source and drain electrodes 5 and 6 contact the semiconductor layer 4 is a substantially reversed manner with respect to that shown in FIG. 3.

When it comes to the fabrication of an integrated circuit by the use of any of these prior art thin film transistors, or when it comes to the use of any of these prior art thin film transistors as an addressing element for a matrix type liquid crystal display device, pattern dimensions of the source, drain and gate electrodes and the semiconductor layer are required to be of a precision smaller than several microns. In addition, since the relative positioning of these electrodes is required to a comparable or higher precision, the method requires a high level technology with an increased number of process steps. Moreover, in any of the thin film transistors manufactured according to conventional methods, an overlapping area tends to be formed between the gate and source electrodes, involving generation of an unnecessary capacitance therebetween, on the one hand, and rendering a portion of the insulating film at the overlapping area to be susceptible to dielectric breakdown, on the other hand. Therefore, the insulating film in the prior art thin film transistor is susceptible to damage.

SUMMARY OF THE INVENTION

Accordingly, this invention has been developed with a view to substantially eliminating the above described disadvantages and inconveniences and also a problem arising when it comes to the formation of a plurality of thin film transistors on a single insulating substrate. Specifically, this invention has for its essential object to provide a highly reliable thin film transistor, and a method for making the same, wherein even though either an etching technique or a lift-off technique is employed in each process step during the manufacture of the thin film transistor, there is no possibility of the occurrence of disconnection, which would result from the presence of steps or indents at the peripheral edge of the pattern, and also of dielectric breakdown which would result from the concentration of an electrical field.

To accomplish the above described object of this invention, a thin film transistor is manufactured by placing a patterned mask, having a predetermined patterned opening defined therein, on a semiconductor layer deposited on an electrically insulating substrate, oxidizing a portion of the semiconductor layer, which has been exposed through the patterned opening, and its peripheral edge, to form an oxide film having an electrically insulating property, controlling the oxidization and degree of penetration of the oxide film so that the semiconductor layer beneath the oxide film is maintained at a predetermined thickness, and removing the patterned mask after an electroconductive film has been formed on the patterned mask. In so doing, there results a thin film transistor having a electroconductive layer formed on the oxide film in a pattern corresponding to the patterned opening in the mask.

Alternatively, after a conductor layer has been formed on the semiconductor layer on the substrate, the oxidizing step may be carried out so as to oxidize the conductor layer in a predetermined pattern to form an electrically insulating oxide film which penetrates completely the thickness of the conductor layer at a portion corresponding to the predetermined pattern.

BRIEF DESCRIPTION OF THE DRAWINGS

These and other objects and features of this invention will become apparent from the following detailed description taken in conjunction with preferred embodiment thereof with reference to the accompanying drawings, in which:

FIGS. 5 to 9 illustrate the sequence of formation of a thin film transistor according to a preferred embodiment of this invention, wherein FIGS. 5b, 6b, 7b, 7c, 8b, 9b and 9c are cross-sectional views taken along the respective lines shown in FIGS. 5a, 6a, 7a, 8a and 9a; and FIGS. 10 to 14 illustrate the sequence of formation of the thin film transistor according to another preferred embodiment of this invention, wherein FIGS. 10b, 11b, 12b, 12c, 13b, 14b and 14c are cross-sectional views taken along the respective lines shown in FIGS. 10a, 11a, 12a, 13a and 14a.

Before the description of this invention proceeds, it is to be noted that like parts are designated by like reference numerals throughout the accompanying drawings.

Figure 1:
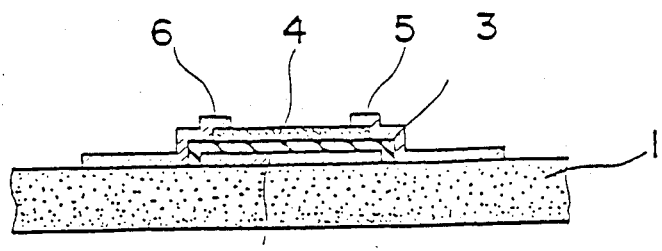
FIGS. 1 to 4 are cross-sectional views of different types of the prior art thin film transistors.
Figure 2:
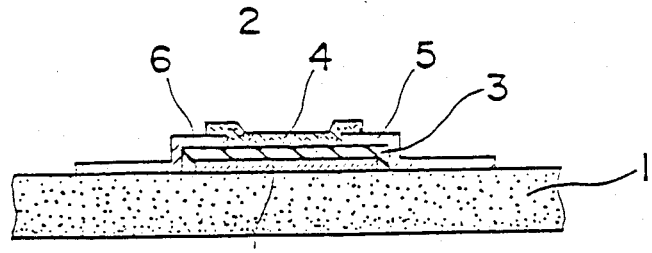
Figure 3:
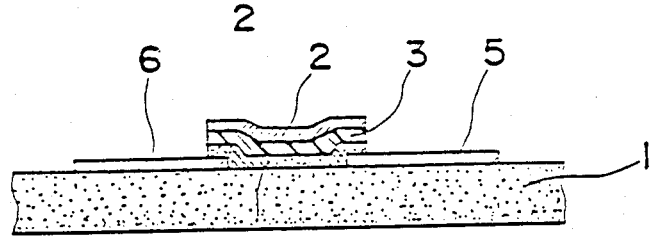
Figure 4:
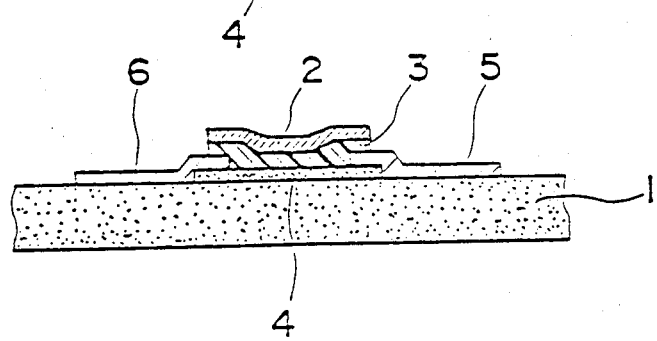
Figure 5A:
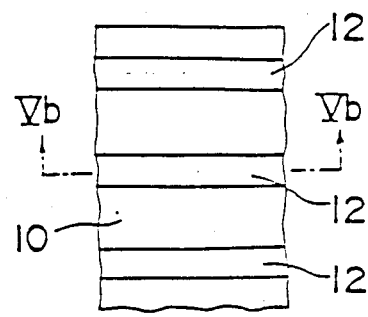
FIGS. 5a, 6a, 7a, 8a and 9a are top plan views of a portion of the thin film transistor being manufactured.
Figure 5B:
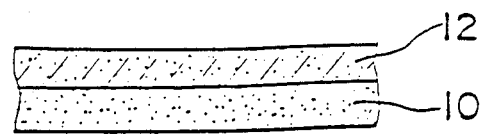
Figure 6A:
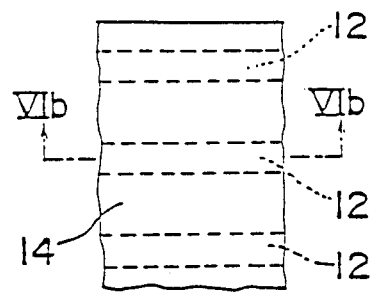
Figure 6B:
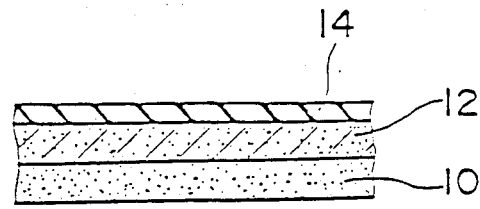
Figure 7A:
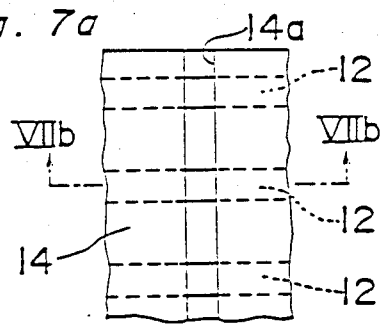
Figure 7B:
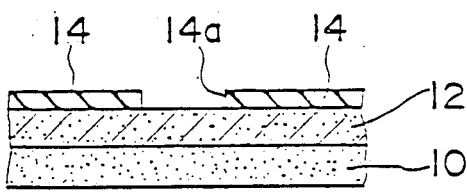
Figure 7C:
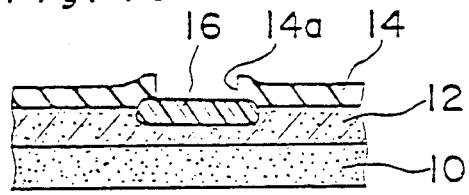
Figure 8A:
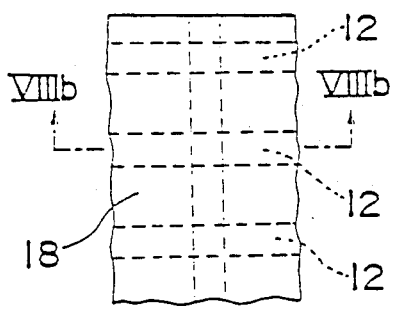
Figure 8B:
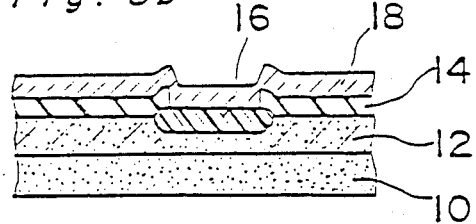

Referring first to FIGS. 5 to 9, an insulating substrate 10 has one surface formed with semiconductor layers 12 of, for example, Te, in a thickness of about 700 Å by the use of a vacuum vapor deposition technique or the like, as best shown in FIGS. 5a and 5b. It is to be noted that, where a thin film transistor array is to be manufactured, the semiconductor layers 12 are, as shown in FIG. 5a, formed in a predetermined pattern by the use of a lift-off technique or the like. Subsequently, as shown in FIGS. 6a and 6b, a photo resist layer 14 is formed on the semiconductor layers 12 and is, after having been exposed and developed, locally removed to define a predetermined patterned opening 14a which may be in the form of, for example, a ribbon-shaped opening as shown in FIG. 7a. The photo resist layer 14 with the patterned opening 14a defined therein constitutes a patterned mask. Thereafter, the substrate 10 having the semiconductor layers 12 and the photo resist layer 14 thereon is immersed in an ethylene glycol solution of, for example, ammonium tartrate, and portions of the semiconductor layers 12 exposed through the patterned opening 14a and their peripheral edges are anodized to form electrically insulating oxide films 16 of $TeO_2$, as shown in FIG. 7c. At this time, the process of anodization should be controlled so as to render portions of the semiconductor layer 12 beneath the associated oxide film 16 to have a thickness of about 60 Å. Then, the assembly is rinsed to remove the residue of the solution with care being taken to avoid any possible peeling of the photo resist layer 14. After the rinse, an electroconductive film 18 of, for example, Ni, is deposited in a thickness of about 500 Å by the use of a vacuum deposition technique over the entire surface of the photo resist layer 14 and the oxide layer 16, as shown in FIGS. 8a and 8b. Finally, the assembly is immersed in acetone and treated with an ultrasonic wave to remove the photo resist layer 14 together with a portion of the electroconductive layer 18 overlaying such photo resist layer 14, thereby completing the thin film transistor array of a construction best shown in FIGS. 9a, 9b and 9c.

Figure 9A:
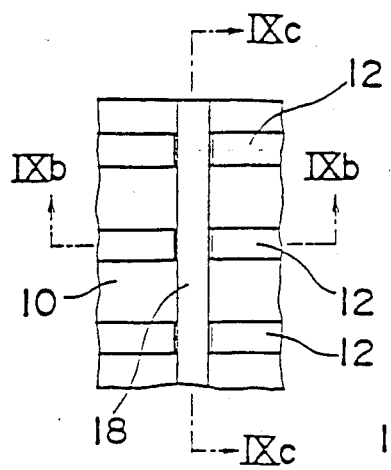
Figure 9B:
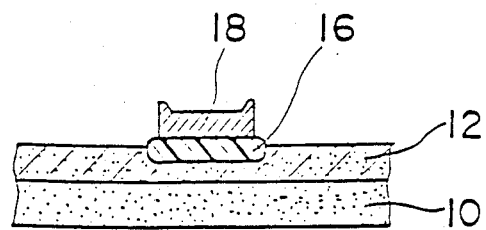
Figure 9C:
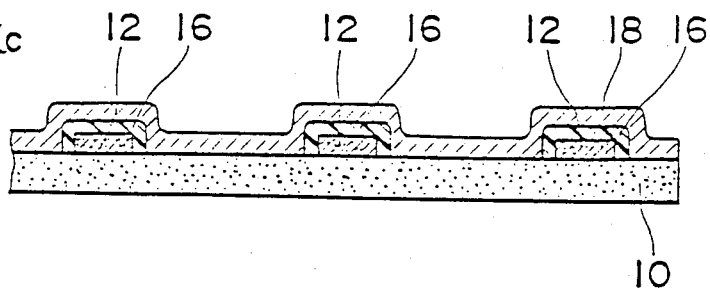

Referring particularly to FIG. 9b, the electroconductive layer 18 remaining above the insulating oxide layer 16 constitutes a gate electrode, a reduced thickness area of the semiconductor layer 12 beneath the insulating oxide layer 16 constitutes the semiconductor layer, and large thickness areas of the semiconductor layer 12 on respective sides of the reduced thickness area of the same respectively constitute a source electrode and a drain electrode.

It is to be noted that, in the foregoing embodiment, a material for the semiconductor layers 12 may not be limited to Te, but any one of Si (in any form either monocrystalline, polycrystalline, or non-crystalline), GaAs, GaP and the like may be used therefor.

An alternative method for making the thin film transistor according to another preferred embodiment of the present invention will now be described with reference to FIGS. 10 to 14.

Figure 10A:
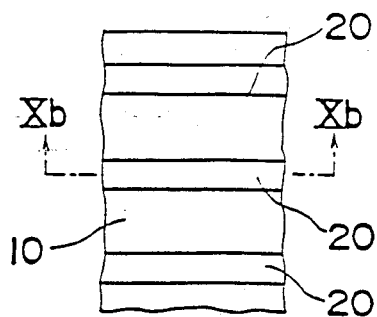
Figure 10B:
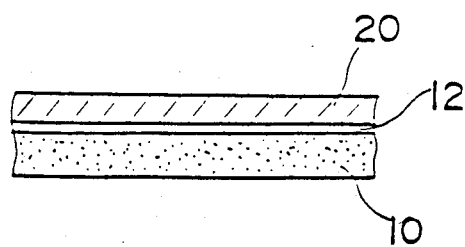

As shown in FIGS. 10a and 10b, subsequent to the formation of the semiconductor layers 12 of, for example, Te, having a thickness of about 60 Å on the insulating substrate 10, conductor layers 20 of, for example, Ta, having a thickness of about 500 Å are formed on the semiconductor layers 12 by the use of a sputtering technique. It is to be noted that, where a thin film transistor array is to be manufactured, the semiconductor layers 12 and the conductor layers 20 are formed in a predetermined pattern, as shown in FIG. 10a. The patterning or pattern formation can easily be achieved either by forming a photo resist layer, having a pattern reversal to a desired pattern, then successively forming the semiconductor layer 12 and the conductor layer 20 thereon, and, lifting the photo resist layer off or subjecting it to a dry etching process after the formation of a photo resist layer having a desired pattern on the semiconductor layer 12 and the conductor layer 20 in which $CF_4$ is used.

Figure 11A:
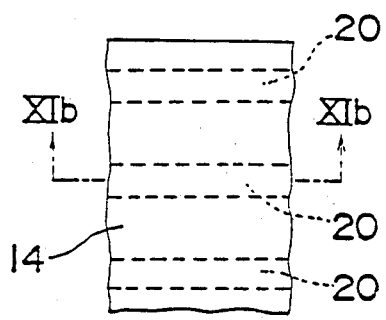
Figure 11B:
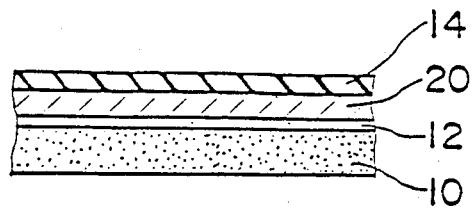
Figure 12A:
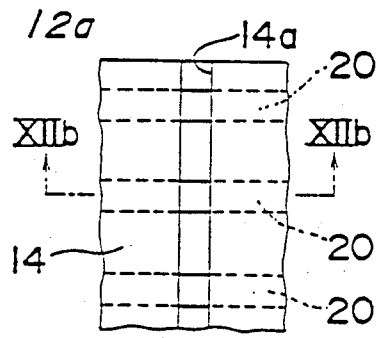
Figure 12B:
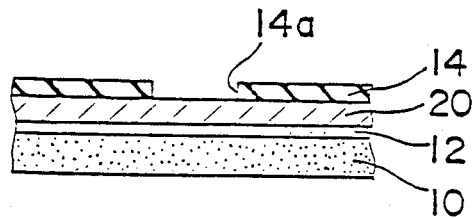
Figure 12C:
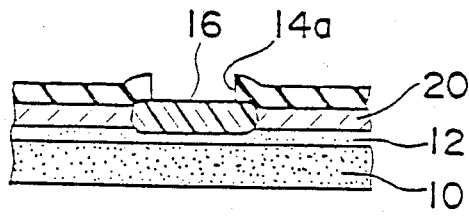
Figure 13A:
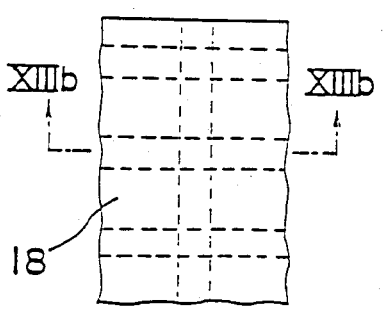
Figure 13B:
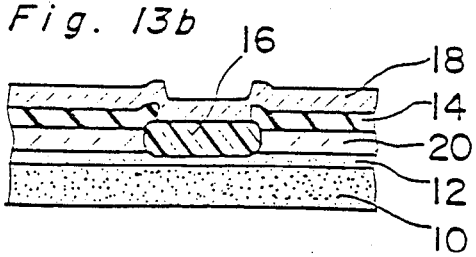

Thereafter, as shown in FIGS. 11a and 11b, a resist layer 14 is formed so as to overlay the patterned semiconductor and conductor layers 12 and 20 and is, then, after having been exposed and developed, locally removed to form a patterned mask 14 having such a patterned opening as shown by 14a in FIGS. 12a and 12b. The assembly is then immersed in an aqueous solution of 3% ammonium tartrate and is, while immersed in the solution, anodized by the application of a constant voltage of 60 V so that portions of the conductor layers 20 exposed through the patterned opening 14a in the patterned mask and their peripheral edges can be oxidized to form electrically insulating oxide films 16 of $Ta_2O_5$. At this time, the process of oxidization should be so controlled as to occur at least over the entire thickness of the conductor layers 20 and, preferably to such an extent that the semiconductor layers 12 can also be slightly oxidized, as shown in FIG. 12c. Then, the assembly is rinsed to remove the residue of the solution with care being taken to avoid any possible peeling of the resist layer 14. After the rinse an electroconductive layer 18 of, for example, Ni, having a thickness of about 500 Å is deposited by the use of a vacuum deposition technique over the entire surface of the resist layer 14 and the oxide layer 16, as shown in FIGS. 13a and 13b. Finally, the assembly is immersed in acetone and treated with an ultrasonic wave to remove the resist layer 14 together with a portion of the electroconductive layer 18 overlaying such resist layer 14, thereby completing the thin film transistor array of a construction best shown in FIGS. 14a, 14b and 14c.

Figure 14A:
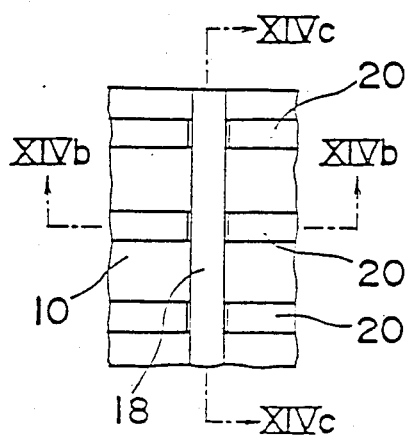
FIGS. 10a, 11a, 12a, 13a and 14a are top plan views of a portion of the thin film transistor being manufactured
Figure 14B:
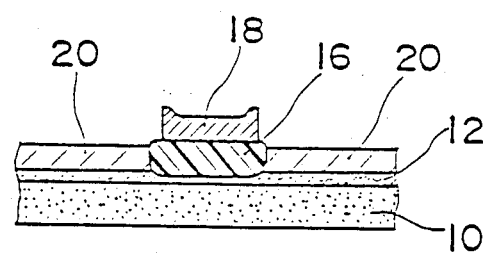
Figure 14C:
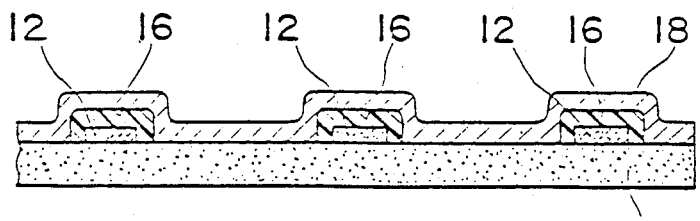

Referring particularly to FIG. 14b, the electroconductive layer 18 remaining on the insulating oxide layer 16 constitutes a gate electrode, a reduced thickness portion of the semiconductor layer 12 beneath the insulating oxide layer 16 constitutes the semiconductor layer, and large thickness areas of the conductor layers 20 on respective sides of the insulating oxide layer 16 constitute source and drain electrodes, respectively.

Even in the embodiment described with reference to FIGS. 10 to 14, a material for the semiconductor layer 12 may not be limited to Te, but any one of Si (in any form either monocrystalline, polycrystalline, or non-crystalline), InSb, PbS, CdSe, GaAs, CdTe and the like may be used therefor. In addition, in the second mentioned embodiment, a material for the conductor layer 20 may not be limited to Ta, but any one of Al, Hf, Nb, Ti and the like may be used therefor.

In any one of the foregoing embodiments, the formation of the oxide layers by anodization which has been described as having been carried by the use of the electrolyte may be carried out by the use of an oxygen plasma.

It is to be noted that, in any of the foregoing embodiments, since the spacing between the gate electrode and the source or drain electrode is about 1 $\mu$ at maximum and since the parasitic resistance resulting from the semiconductor layer falling in that space can be so small as to be negligible with respect to the channel length of about 10 $\mu$ or more, no problem occurs in practice.

As hereinbefore described, the method according to this invention is not only simple with the reduced number of process steps, but is effective to produce a thin film transistor wherein no overlapping between the gate electrode and the source or drain electrode takes place, consequently minimizing stray capacitance between the gate and source electrodes as well as minimizing the possibility of the occurrence of dielectric breakdown of the gate insulating layer. In particular, in the method according to the second mentioned embodiment, a good gate insulating layer with the extremely minimal number of pinholes can advantageously be formed because of the utilization of the anodization on the one hand and, on the other hand, since it becomes possible to provide a relatively wide freedom of choice of a combination of materials for the semiconductor layer and the gate electrode, the pinch-off voltage in the resultant thin film transistor can be advantageously set to a desired value.

Although this invention has fully been described in connection with the preferred embodiments thereof with reference to the accompanying drawings, it should be noted that various changes and modifications are apparent to those skilled in the art. Such changes and modifications are to be understood as included within the scope of this invention unless they depart therefrom.

What is claimed is:

1. A method for making a thin film transistor comprising the steps of:

forming a semiconductor layer on one surface of an electrically insulating substrate;

placing a patterned mask having a predetermined pattern opening defined thereby on said semiconductor layer; oxidizing a portion of said semiconductor layer which is exposed through the pattern opening and a peripheral edge of said semiconductor layer to form an oxide layer having an electrically insulating property, said oxidizing step being controlled so as to render a portion of said semiconductor layer underneath said oxide layer to have a predetermined thickness;

forming an electroconductive layer on said patterned mask;

and removing said patterned mask so as to leave a portion of said electroconductive layer, corresponding to the pattern opening, on the oxide layer to form a gate electrode.

2. A method as claimed in claim 1, wherein the oxidizing step is carried out by an anodization.

3. A method as claimed in claim 1, wherein said patterned mask is formed by a photo resist layer.

4. A method for making a thin film transistor comprising the steps of;

forming a semiconductor layer; placing a patterned mask having a predetermined pattern opening defined thereby on said semiconductor layer; oxidizing a portion of the semiconductor layer, which is exposed through the pattern opening, and a peripheral edge thereof to cause said portion of the semiconductor layer and said peripheral edge to be transformed into an oxide layer completely across the thickness of said semiconductor layer, said oxide layer having an electrically insulating property; forming an electroconductive layer on the patterned mask; and removing the patterned mask so as to leave a portion of the electroconductive layer, corresponding to the pattern opening, on the oxide layer.

* * * * *